(12) United States Patent
Sekel et al.

(10) Patent No.: US 6,437,552 B1
(45) Date of Patent: Aug. 20, 2002

(54) AUTOMATIC PROBE IDENTIFICATION SYSTEM

(75) Inventors: Stephen Mark Sekel, Camas, WA (US); Stanley Joseph Sula, Portland, OR (US)

(73) Assignee: LeCroy Corporation, Beaverton, OR (US)

( * ) Notice: Subject to any disclaimer, the term of this patent is extended or adjusted under 35 U.S.C. 154(b) by 0 days.

(21) Appl. No.: 09/629,246

(22) Filed: Jul. 31, 2000

(51) Int. Cl.[7] .......................... G01R 31/02; G01R 13/20
(52) U.S. Cl. ..................................... 324/72.5; 324/121 R
(58) Field of Search ........................... 324/121 R, 72.5, 324/754, 556, 133, 102, 149, 115; 702/66, 67, 68; 340/815.45, 815.65, 815.66, 815.67; 345/82, 83

(56) References Cited

U.S. PATENT DOCUMENTS

| | | | | |
|---|---|---|---|---|
| 3,958,235 A | * | 5/1976 | Duffy | 345/82 |
| 4,739,253 A | * | 4/1988 | Everhart et al. | 324/121 R |
| 5,293,122 A | * | 3/1994 | Cake et al. | 324/754 |
| 5,920,297 A | * | 7/1999 | Alexander | 345/83 |

* cited by examiner

Primary Examiner—Michael J. Sherry
Assistant Examiner—Paresh Patel
(74) Attorney, Agent, or Firm—Karen Dana Oster

(57) ABSTRACT

The automatic probe identification system of the present invention automatically identifies an electrical test probe as being associated with a particular channel. Specifically, an automatic probe identification system of the present invention includes a testing instrument and at least one test probe. The testing instrument preferably has at least one input channel, each input channel being visually represented by a unique channel identification such as a colored trace. The test probe has a probe identifier such as a full-spectrum LED for selectively visually representing a unique probe channel identification. The probe identifier automatically visually represents a unique probe channel identification corresponding to the unique channel identification of the input channel to which it is coupled. An additional benefit of this system is that the probe identifier used in one preferred embodiment of the test probe provides additional illumination for shadowed or dark places.

20 Claims, 5 Drawing Sheets

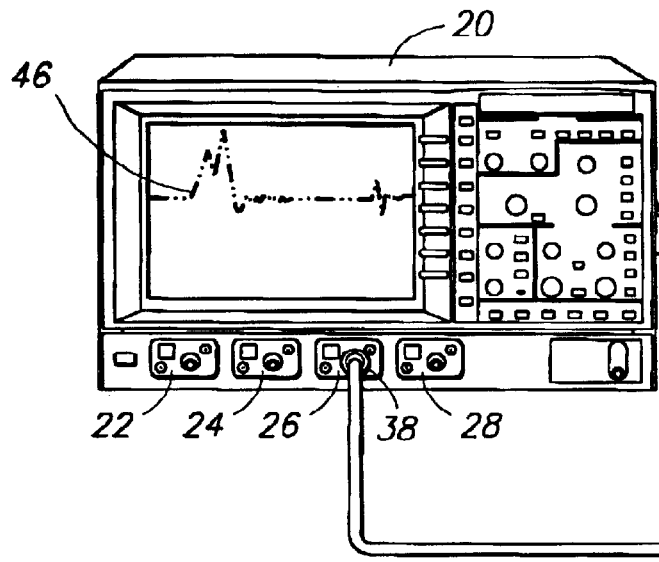
FIG. 3
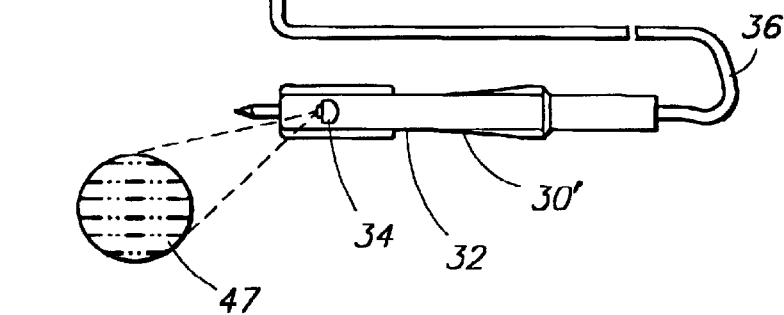
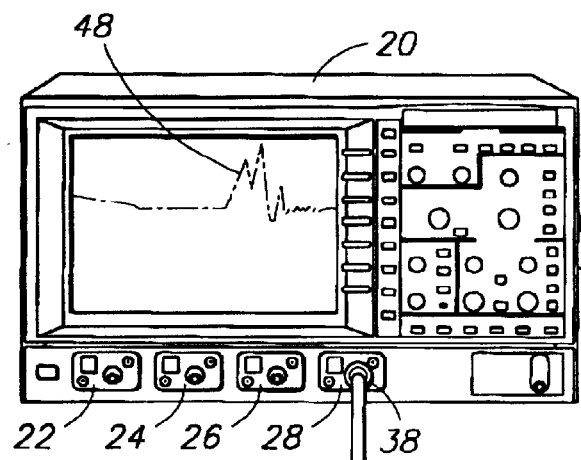
FIG. 4
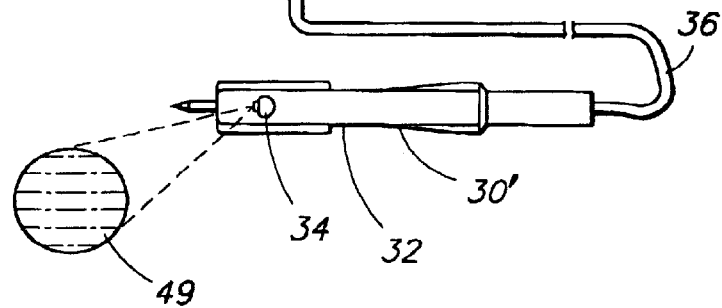

AUTOMATIC PROBE IDENTIFICATION SYSTEM

BACKGROUND OF THE INVENTION

The present invention relates generally to electrical test probes for testing instruments and specifically to an identification system to associate a probing head to a specific channel of a testing instrument.

An electrical test probe generally consists of a probing head, a cable, and a connector. The probing head may have an integral or replaceable probing tip that is suitable for making an electronic contact with electrical components. The probing head is attached to a first end of the cable and the connector is attached to the opposite end of the cable.

Electrical test probes are used to provide an electrical connection between electrical components and testing instruments such as oscilloscopes and other measuring, monitoring, diagnostic, and signal processing instruments. Most testing instruments have multiple channels, each channel having its own input. An electrical test probe may be attached to one or more channel inputs using the test probe's connector. As an electrical component is probed with an electrical test probe, its signal registers on the testing instruments. Because multiple electrical test probes may be used simultaneously, it is important to be able to identify which signal is emanating from which electrical test probe.

A set of colored bands, known as "chicken bands," is old technology that has been used to associate a signal from a test probe with the visual signal being displayed on the testing instruments. To use chicken bands, one band is attached to the cable substantially adjacent the probing head of a test probe and a second band of the same color is attached to the cable substantially adjacent the channel input of the testing instruments. One problem with chicken bands is that the user must attach the bands individually, which is extra work and adds the possibility of human error. Another problem is that chicken bands have a tendency to fall off and get lost.

Newer technology that has been used to associate a signal from a test probe with the visual signal being displayed on testing instruments is a set of colored rings on one or both ends of the cable of a test probe. The colored rings adjacent the probing head can be exchanged to correspond to a corresponding exchanged color ring adjacent the testing instrument channel input. Since the rings are around the cable, there is no problem with losing chicken bands. There is, however, the problem of the additional work of exchanging the rings and the possibility of human error.

Some testing instruments are equipped with visual signals (such as the traces on a signal display) that are color-coded to a particular channel input. For example, recent LeCroy Corporation oscilloscopes have a distinctive color permanently assigned to the displayed trace of each channel. Since the visual signals are color-coded, only the probing head needs to be identified. The user attaches a chicken band or exchanges a colored ring to correspond with the visual input signal. This eliminates the need to exchange half of the rings or attach half of the chicken bands.

U.S. Pat. No. 6,052,807 to Nygaard, Jr. is directed to a device (the "Nygaard device") that is able to identify the channel of a particular probe from among a plurality of test probes. Each test probe emits its own signal ("uncommon ID signal"). The multi-channel measurement equipment identifies the probe-to-channel correspondence when a test probe is touched to an "identification terminal." When the user touches the probe to the identification terminal, the identification of the associated channel is indicated by illuminating an annunciator light or displaying a numerical indicator (one or more LED or LCD digits), or it may involve displaying a message on a screen. The LED, LCD, or message is on the multi-channel measurement equipment. In other words, the Nygaard device requires the user to remove the test probe from a circuit board and to look at the multi-channel measurement equipment. This can be distracting, can cause difficult connections to be lost, and can be time-consuming.

BRIEF SUMMARY OF THE INVENTION

The automatic probe identification system of the present invention improves on testing instruments that are equipped with visual signals (such as the traces on a signal display) that are color-coded to a particular channel. Specifically, the automatic probe identification system of the present invention automatically identifies an electrical test probe as being associated with a particular channel. A single electrical test probe may be connected to any channel of a testing instrument and automatically indicates to which channel it has been connected. An additional benefit of this system is that the LED used in one preferred embodiment provides additional illumination for shadowed or dark places.

Specifically, an automatic probe identification system of the present invention includes a testing instrument and at least one test probe. The testing instrument preferably has at least one input channel, each input channel being visually represented by a unique channel identification such as a colored trace. The test probe has a probe identifier such as a full-spectrum LED for selectively visually representing a unique probe channel identification. The probe identifier visually represents a unique probe channel identification corresponding to the unique channel identification of the input channel to which it is coupled.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWING

FIGS. 1–4 show a testing instrument with a unique channel identification permanently assigned to the visual signal of each channel connected to an automatic probe identification system test probe of the present invention having a unique probe channel identification corresponding to the unique channel identification of the input channel to which it is coupled.

DETAILED DESCRIPTION OF THE INVENTION

Figure 1:
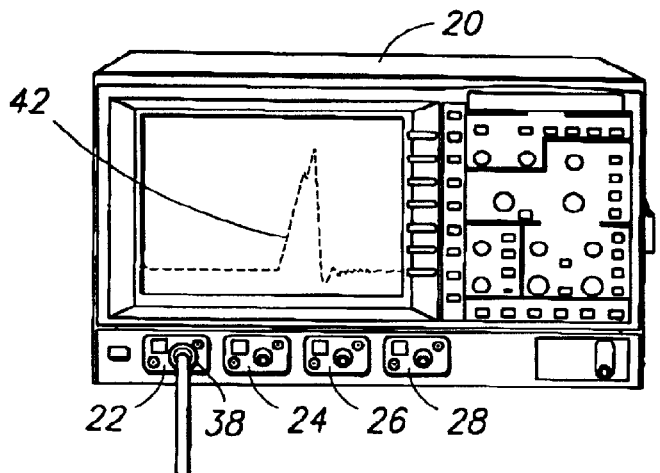
Figure 1:
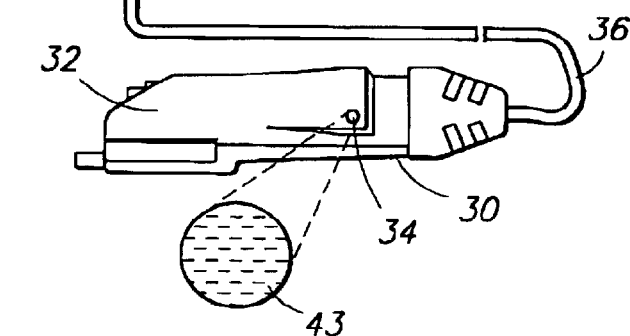

The automatic probe identification system of the present invention improves on testing instruments that are equipped with visual signals that are color-coded to a particular channel. Specifically, the automatic probe identification system of the present invention automatically identifies an electrical test probe as being associated with a particular channel. A single electrical test probe may be connected to any channel of a testing instrument and automatically indicates to which channel it has been connected.

FIGS. 1–4 show one exemplary embodiment of the present invention. These figures show a testing instrument 20 with four channels 22, 24, 26, 28. The figures show a test probe 30, having a probing head 32, with a probe identifier 34 (shown as a full-spectrum LED), a cable 36, and a connector 38. The probe identifier 34 changes based on the channel 22, 24, 26, 28 to which the test probe 30 is attached.

FIG. 1 shows an exemplary test probe 30 of the present invention connected to channel one 22 of the testing instrument 20. The visual signal 42 is displayed, for example, as an amber-colored wave form. Because the test probe 30 is connected to channel one 22, the probe identifier 34 glows amber (shown in enlarged circle 43). In this shown embodiment the probe identifier 34 is located in the middle-back of the probing head 32.

Figure 2:
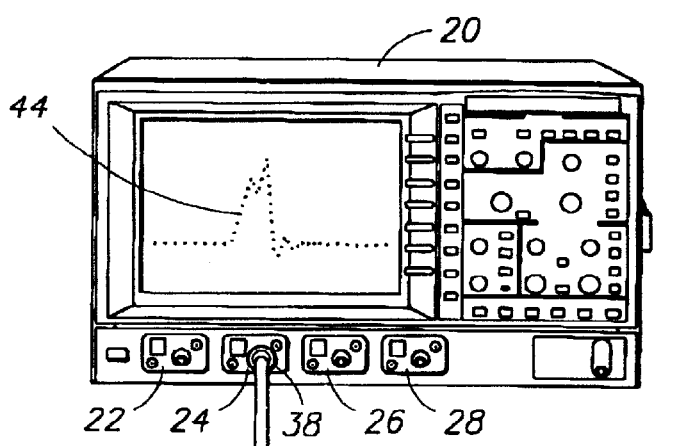
Figure 2:
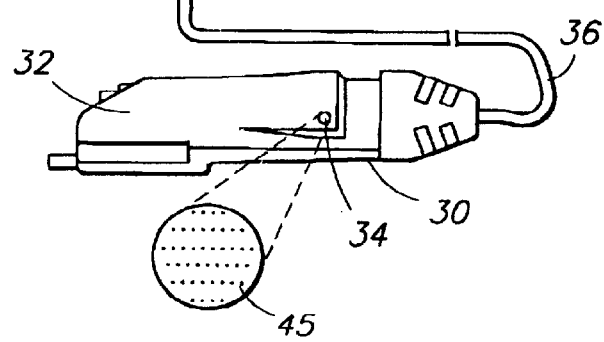

FIG. 2 shows the exemplary test probe 30 of the present invention connected to channel two 24 of the testing instrument 20. The visual signal 44 is displayed, for example, as a raspberry-colored wave form. Because the test probe 30 is connected to channel two 24, the probe identifier 34 glows raspberry (shown in enlarged circle 45).

FIG. 3 shows an alternative exemplary test probe 30' which is similar to the test probe 30 except that the probe identifier 34 is located on the bottom of the probing head 32. The test probe 30' is connected to channel three 26 of the testing instrument 20. The visual signal 46 is displayed, for example, as an ocean-spray-colored wave form. Because the test probe 30' is connected to channel three 26, the probe identifier 34 glows ocean spray (shown in enlarged circle 47).

FIG. 4 shows the alternate exemplary test probe 30' of the present invention connected to channel four 28 of the testing instrument 20. The visual signal 48 is displayed, for example, as a green-colored wave form. Because the test probe 30' is connected to channel four 28, the probe identifier 34 glows green (shown in enlarged circle 49).

The location of the probe identifier 32 may be in the middle-back of the probing head 32 (FIGS. 1 and 2), on the bottom of the probing head 32 (FIGS. 3 and 4), on the front of the probing head 32 between the ground and tip sockets, deep within the electronics so that the entire probe glows when the probe identifier 32 glows, or in any other position. It should be noted, however, that certain locations and certain intensities would allow the probe identifier to provide extra illumination for the circuit board and components to be probed thereon. This is true of the embodiment of FIGS. 3 and 4.

In one preferred embodiment of the present invention the probe identifier 34 is a "full-spectrum LED," consisting of three separate LEDs integrated into one package, to create a light source capable of emitting any color of the visible spectrum, in much the same way as the three colors of phosphor on a color CRT can be used to reproduce the full spectrum of colors.

It should be noted that one alternate preferred embodiment could have other colors associated with the input channels. Another alternate preferred embodiment could have more than four channels or less than four channels. Still another preferred alternate embodiment could include a different type of probe identifier such as multiple probe identifiers of a single color (where one lights up for channel one, two light up for channel two, three light up for channel three, etc.), a numerical or alphabetical reference, or any other unique identifier.

Figure 5A:
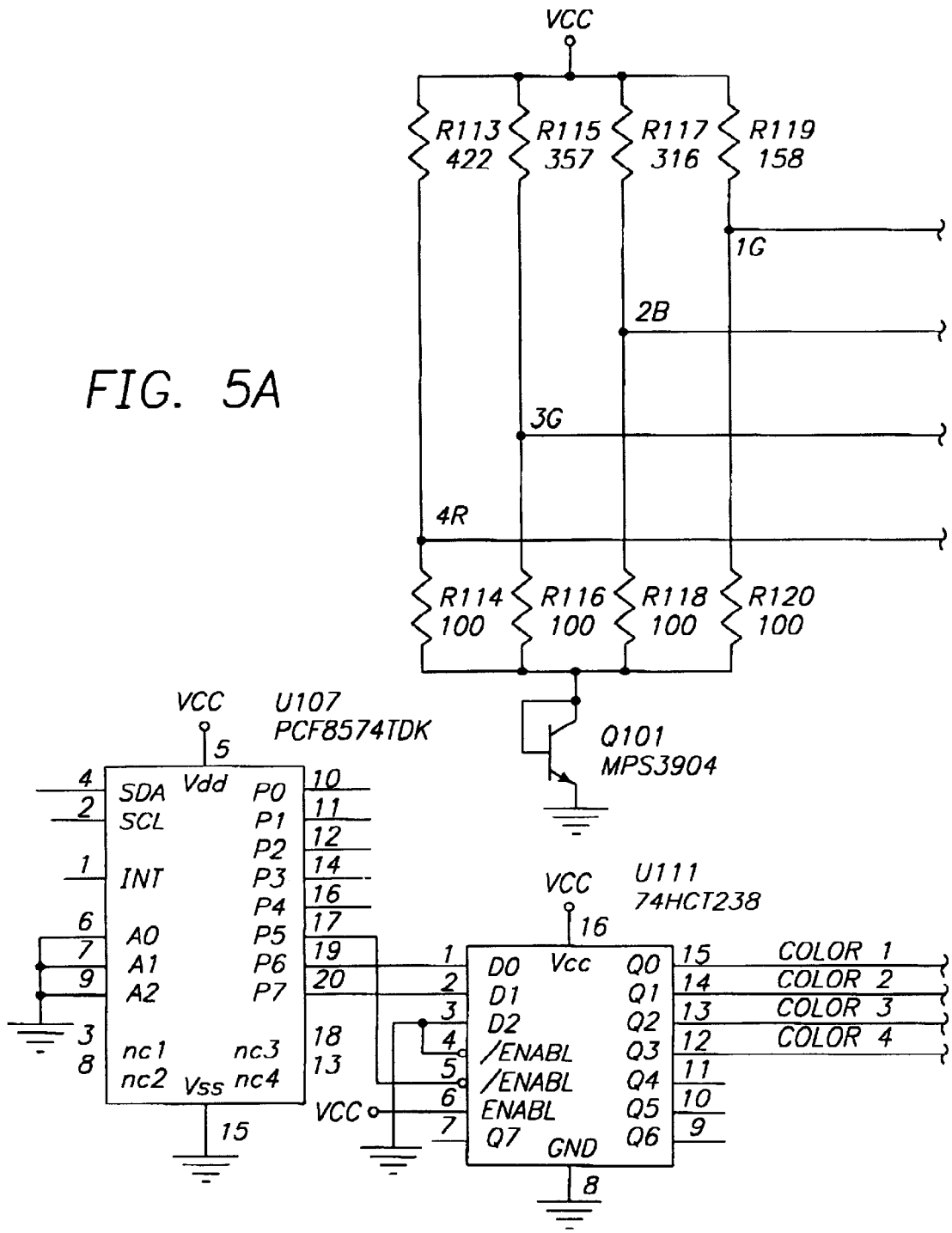
FIGS. 5A–5C show an exemplary circuit diagram of circuitry suitable for implementing the automatic probe identification system of the present invention.
Figure 5B:
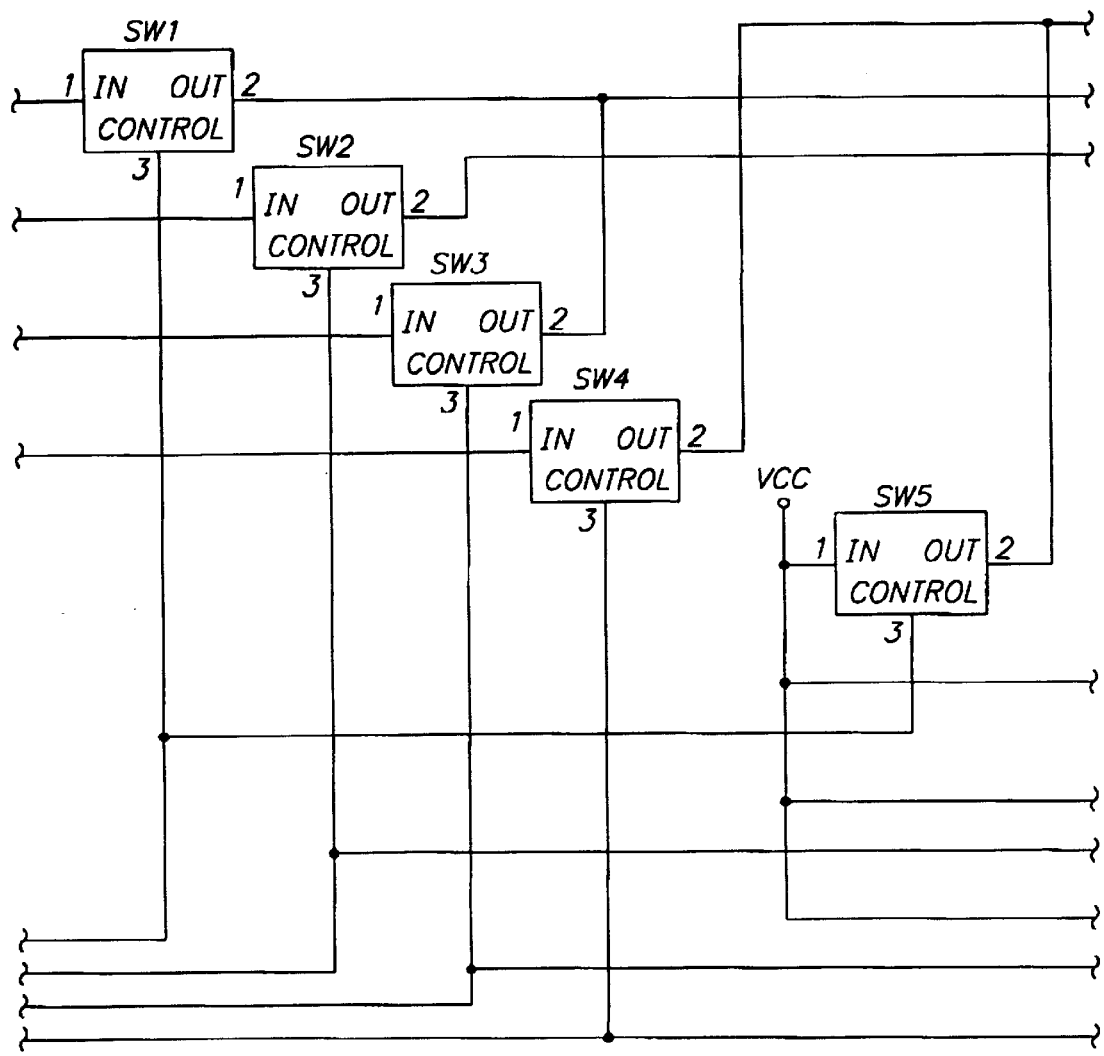
Figure 5C:
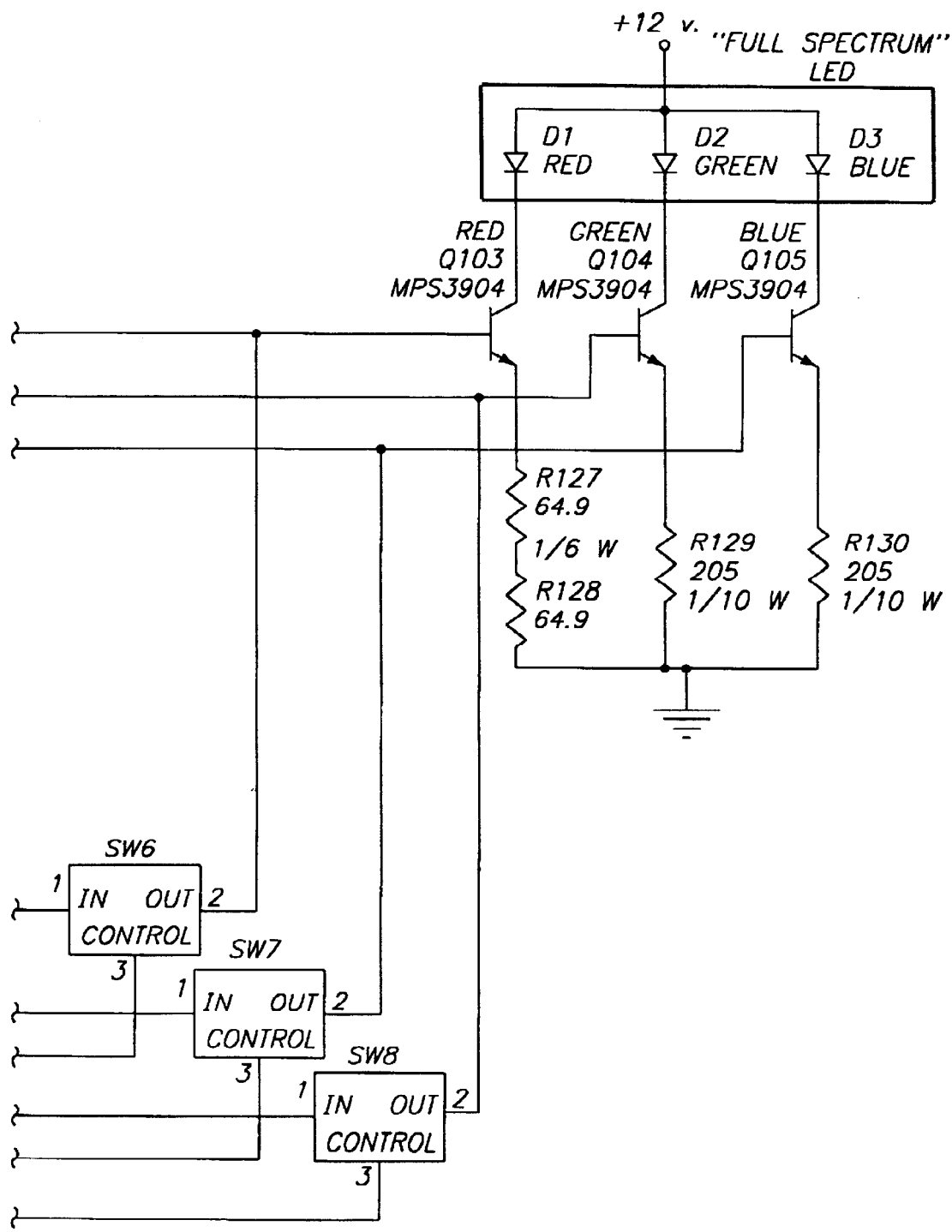

FIGS. 5A–5C show exemplary circuitry suitable for implementing the present invention. For this exemplary circuitry, a signal is sent from the testing instrument, through a probe interface, to pin 4 of U107. The signal could be a digital signal, an analog signal, or a signal of a different format. The shown embodiment transmits a two-bit word; however, alternate formats are possible. As shown, the signal is sent serially; however, it could be sent in parallel or in other alternate manners. This data is latched by U107 and appears on pins 19 and 20 of the same IC. This two-bit binary word is then applied to the input of U111, that is a 3-to-8 line decoder, meaning that it takes a 3-bit binary code and converts it to a high logic state which appears on one of eight separate outputs. Since only two bits are used in the shown exemplary embodiment, U111 actually functions as a 2-to-4 line decoder, with the four outputs being pins 12, 13, 14, and 15. These four outputs correspond to the four testing instrument channels.

When the test probe is plugged into channel one of the oscilloscope, the oscilloscope sends data to the test probe that causes pin 15 of U111 to be set at a logic high (+5 volts in this case). Similarly, when the probe is plugged into channel two, pin 14 of U111 is set high, and so on for the other two channels. These four output pins of U111 each control two CMOS-type analog switches (SW1 through SW8). Of the two switches controlled by each of the U111 outputs, one directs the full logic voltage (5 volts) to the base of the appropriate current-source transistor, resulting in maximum current being drawn through that particular LED. (This LED represents the dominant primary color for that channel.) The other of the two switches controlled by each of the U111 outputs applies a fraction of the full logic voltage (set by one of four voltage dividers consisting of resistors R113 through R120) to one of the other current source transistors. This results in an appropriate fraction of the maximum current to be drawn through its respective LED. (This LED represents the second color necessary to give the correct color shade for that particular channel.)

As shown in FIG. 5C, each of the three LED components (D1–D3) of the full spectrum LED are attached to a programmable current source (Q103, Q104, and Q105), each of which draws a current through its respective LED. The magnitude of this current is directly proportional to a control voltage that is applied to the base terminal of each of the three transistors. As set forth above, for each of the four colors, the dominant primary color is illuminated at full intensity (just under the maximum rated current for that particular LED), and a second color is illuminated at a lesser intensity to give the proper shade of color. To illustrate, the table below lists the color combinations involved.

| DESIRED COLOR | RED LED CURRENT | GREEN LED CURRENT | BLUE LED CURRENT |
| --- | --- | --- | --- |
| Amber (Channel 1) | 33.5 mA | 8.2 mA | 0 |
| Raspberry (Channel 2) | 33.5 mA | 0 | 5.1 mA |
| Ocean Spray (Channel 3) | 0 | 4.6 mA | 21 mA |
| Green (Channel 4) | 6.3 mA | 21.5 mA | 0 |

Since the four colors needed in this particular application are widely separated within the visible spectrum, it has been found that only two of the three LED's (D1–D3) need to be illuminated at any one time to accurately reproduce the desired colors.

One optional feature of the preferred invention is to disable the probe identifier 34 when the test probe 30 is plugged into an older testing instrument 20 that does not send channel identification data to the test probe 30. This may be accomplished, for example, by using the P5 output (pin 17) of U107 to drive one of the "enable" inputs of U111. The functionality of U111 is such that it will produce no output (all of its outputs will be at a logic low) unless pin 5 is held at a logic low. With all of the outputs low, all of the LEDs will be turned off. Newer testing instruments 20 such as LeCroy Corporation oscilloscopes have software specifications in which the digital data sent to the test probe 30 sets pin 17 of U107 low, in addition to sending the data that defines the color to be produced by the full-spectrum LED. With pin 17 of U107 at a logic low, the outputs of U111 are enabled and the LED is supplied with the appropriate currents to produce the desired color. When the probe is attached to an older testing instrument 20 that does not have the capability of sending channel identification data to the test probe 30, the absence of the software instruction to set pin 17 of U107 low causes the logic state of this pin to default to a logic high, thus causing the outputs of U111 to be disabled and the LED to be turned off. This prevents confusion when the test probe 20 is used with older devices, but still allows the test probe 20 to function.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. An automatic probe identification system comprising:
   (a) a testing instrument having a plurality of input channels, each input channel visually represented by a unique channel identification;
   (b) a test probe having a probe identifier for selectively visually representing a unique probe channel identification; and
   (c) said probe identifier visually representing a unique probe channel identification corresponding to the unique channel identification of the input channel to which it is coupled.

2. The system of claim 1 wherein said testing instrument is an oscilloscope.

3. The system of claim 1 wherein said plurality of input channels is four input channels.

4. The system of claim 1 wherein said unique channel identification is a trace of a unique color.

5. The system of claim 1 wherein said unique probe channel identifier is a full-spectrum LED.

6. The system of claim 1 wherein said unique probe channel identifier is at least one LED.

7. The system of claim 1 wherein said probe identifier is turned off when the input channel to which it is coupled is turned off.

8. The system of claim 1 wherein said probe identifier is turned off if a testing instrument to which said probe identifier is coupled does not support said automatic probe identification system.

9. The system of claim 1 wherein said testing instrument signals said test probe so that said probe identifier visually represents a unique probe channel identification corresponding to the unique channel identification of the input channel to which it is coupled.

10. The system of claim 1 wherein said test probe signals said testing instrument so that said unique probe channel identifier visually corresponds to the unique channel identification of the input channel to which it is coupled.

11. The system of claim 1 wherein said probe identifier has a continuously variable color.

12. The system of claim 1 wherein said probe identifier is positioned in the middle-back of a probing head of the test probe.

13. The system of claim 1 wherein said probe identifier is positioned on the bottom of a probing head of the test probe.

14. The system of claim 1 wherein said probe identifier provides illumination.

15. A method for automatic probe identification, said method comprising:
   (a) providing a testing instrument having a plurality of input channels;
   (b) selectively representing visually each input channel by a unique channel identification;
   (c) providing a test probe having a probe identifier;
   (d) coupling said test probe to one of said input channels;
   (e) sending a signal from said testing instrument to said test probe indicating said unique channel identification of said input channel to which said test probe is coupled; and
   (f) representing visually a unique probe channel identification on said probe identifier to correspond with the unique channel identification of the input channel to which it is coupled.

16. An automatic probe identification system comprising:
   (a) a testing instrument having a plurality of input channels, each input channel visually represented by a unique channel identification;
   (b) a test probe having a probe identifier for selectively visually representing a unique probe channel identification, said probe identifier located remote from said testing instrument; and
   (c) said probe identifier visually representing a unique probe channel identification corresponding to the unique channel identification of the input channel to which it is coupled.

17. The system of claim 16 wherein said testing instrument signals said test probe so that said probe identifier visually represents a unique probe channel identification corresponding to the unique channel identification of the input channel to which it is coupled.

18. The system of claim 16 wherein said test probe signals said testing instrument so that said unique probe channel identifier visually corresponds to the unique channel identification of the input channel to which it is coupled.

19. The system of claim 16 wherein said probe identifier is positioned in the middle-back of a probing head of the test probe.

20. The system of claim 16 wherein said probe identifier is positioned on the bottom of a probing head of the test probe, said probe identifier provides illumination.

* * * * *